United States Patent
Chiu et al.

(10) Patent No.: US 8,036,611 B2
(45) Date of Patent: Oct. 11, 2011

(54) POLAR TRANSMITTER, METHOD AND APPARATUS FOR PHASE MODULATION

(75) Inventors: Huan-Ke Chiu, Hsinchu County (TW); Chun-Jen Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 385 days.

(21) Appl. No.: 12/436,016

(22) Filed: May 5, 2009

(65) Prior Publication Data
US 2010/0120381 A1    May 13, 2010

(30) Foreign Application Priority Data
Nov. 13, 2008 (TW) ............................. 97143825 A

(51) Int. Cl.
*H04B 1/04* (2006.01)
(52) U.S. Cl. .................. 455/118; 455/110; 455/112
(58) Field of Classification Search ............... 455/42, 455/110, 112, 113, 118
See application file for complete search history.

(56) References Cited

U.S. PATENT DOCUMENTS

| | | | |
|---|---|---|---|
| 6,211,747 B1 | 4/2001 | Trichet et al. | |
| 6,397,044 B1 * | 5/2002 | Nash et al. | 455/73 |
| 6,515,553 B1 | 2/2003 | Filiol et al. | |
| 6,809,598 B1 | 10/2004 | Staszewski et al. | |
| 7,110,730 B2 * | 9/2006 | Okada et al. | 455/127.2 |
| 7,183,860 B2 | 2/2007 | Staszewski et al. | |
| 7,236,754 B2 * | 6/2007 | Sorrells et al. | 455/118 |
| 7,546,096 B2 * | 6/2009 | Sorrells et al. | 455/118 |
| 2007/0085621 A1 | 4/2007 | Staszewski et al. | |
| 2007/0188243 A1 | 8/2007 | Waheed et al. | |
| 2007/0188244 A1 | 8/2007 | Waheed et al. | |
| 2008/0002788 A1 | 1/2008 | Akhtar et al. | |

\* cited by examiner

*Primary Examiner* — Hai L Nguyen

(57) ABSTRACT

A phase modulation method with a polar transmitter. A target frequency is first designated by comparing the RF signal with a reference frequency and the phase sample. An oscillator control word is generated based on the target frequency. A digital oscillator can modulate from a first phase to a second phase to synthesize a preliminary RF signal based on the oscillator control word. When the target frequency exceeds the modulation capability of the digital oscillator, the oscillator control word is generated based on the target frequency minus 180 degrees, and the preliminary RF signal is shifted by 180 degrees to be the RF signal having the target frequency. When the target frequency does not exceed the modulation capability of the digital oscillator, the oscillator control word is generated solely based on the target frequency to output the preliminary RF signal to be the RF signal having the target frequency.

36 Claims, 7 Drawing Sheets

POLAR TRANSMITTER, METHOD AND APPARATUS FOR PHASE MODULATION

BACKGROUND OF THE INVENTION

1. Field of the Invention

The invention is related to a polar transmitter, and particularly to a phase modulator in the polar transmitter and a phase modulation method implemented therein.

2. Description of the Related Art

A polar structure radio frequency (RF) transmitter is a highly developed technology for and a core technology of telecommunication systems. The polar structure radio frequency (RF) transmitter assists power amplifiers to exhibit better performance. In the polar structure, original inphase/quadrature (I/Q) signals are polarized into a pair of magnitude signals and phase signals. Theoretically, significant bandwidths are required to render amplitude and phase signals without degrading the original signal quality. The bandwidth, however, is physically limited, thus undesirable error vector magnitude (EVM) and spectral regrowth problems are induced. It is therefore desirable to develop a simple and cost effective approach to increase the utilization of bandwidths for polar structure radio frequency (RF) transmitters.

BRIEF SUMMARY OF THE INVENTION

A detailed description is given in the following embodiments with reference to the accompanying drawings.

An exemplary embodiment of a polar transmitter is provided for synthesizing an RF signal from a baseband signal. A polar processor transforms the baseband signal into a magnitude sample and a phase sample. A magnitude modulator generates a magnitude control signal based on the magnitude sample. A phase modulator uses the phase sample to synthesize the RF signal having variable phases. A digital power amplifier receives the magnitude control signal to amplify and transmit the RF signal.

In the phase modulator, a loop control unit designates a target frequency based on a reference frequency, the phase sample and the RF signal. A logic control unit generates an oscillator control word of binary form based on the target frequency. A digital oscillator having a capability to modulate from a first phase to a second phase, synthesizes a preliminary RF signal based on the oscillator control word. A phase switch is coupled to the digital oscillator and the logic control unit, selectively shifting the preliminary RF signal by 180 degrees based on a switch signal. When the target frequency exceeds the modulation capability of the digital oscillator, the logic control unit generates the oscillator control word based on the target frequency minus 180 degrees, and sends a switch signal to direct the phase switch to shift the preliminary RF signal by 180 degrees, such that the RF signal is synthesized to have the target frequency. Otherwise, when the target frequency does not exceed the modulation capability of the digital oscillator, the logic control unit generates the oscillator control word solely based on the target frequency, and the phase switch directly outputs the preliminary RF signal to be the RF signal having the target frequency.

A further embodiment is provided, of a phase modulation method implemented on the polar transmitter. A target frequency is first designated by comparing the RF signal with a reference frequency and the phase sample. An oscillator control word is generated based on the target frequency. A digital oscillator having a capability to modulate from a first phase to a second phase is provided for synthesizing a preliminary RF signal based on the oscillator control word. When the target frequency exceeds the modulation capability of the digital oscillator, the oscillator control word is generated based on the target frequency minus 180 degrees, and the preliminary RF signal is shifted by 180 degrees to be the RF signal having the target frequency. When the target frequency does not exceed the modulation capability of the digital oscillator, the oscillator control word is generated solely based on the target frequency, and the preliminary RF signal is directly output to be the RF signal having the target frequency.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
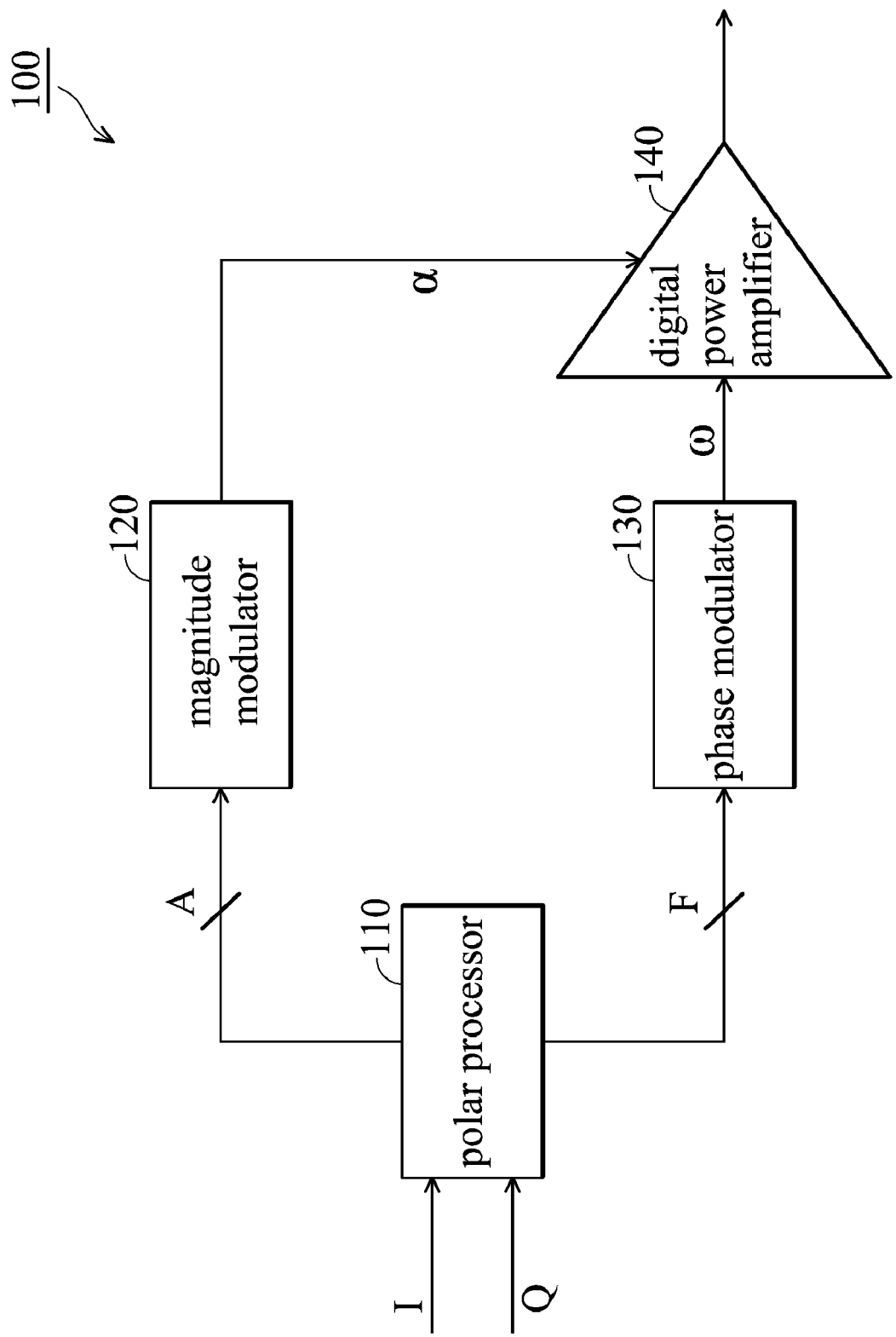
FIG. 1 shows a polar transmitter.

FIG. 1 shows a polar transmitter, and the invention proposes an enhanced phase modulation method to be implemented on the polar transmitter. In the polar transmitter 100, an outbound baseband signal is typically divided into an inphase part and a quadrature part (I/Q), transmitted into a polar processor 110 with a particular data rate. The polar processor 110 can perform a coordinated transformation (conversion) of the baseband signal into a magnitude sample A and a phase sample F. The magnitude sample A is then sent to a magnitude modulator 120, wherein modulation is performed to generate a magnitude control signal α. The phase sample F is sent to a phase modulator 130, and thereby an RF signal ω of variable phases is synthesized. A digital power amplifier 140 then amplifies the RF signal ω based on the magnitude control signal a and then broadcasts the amplified RF signal ω. To maintain transmission quality, generally, the phase modulator 130 must be capable of operating at a high sample rate, and accurately compensating phase errors.

Figure 2:
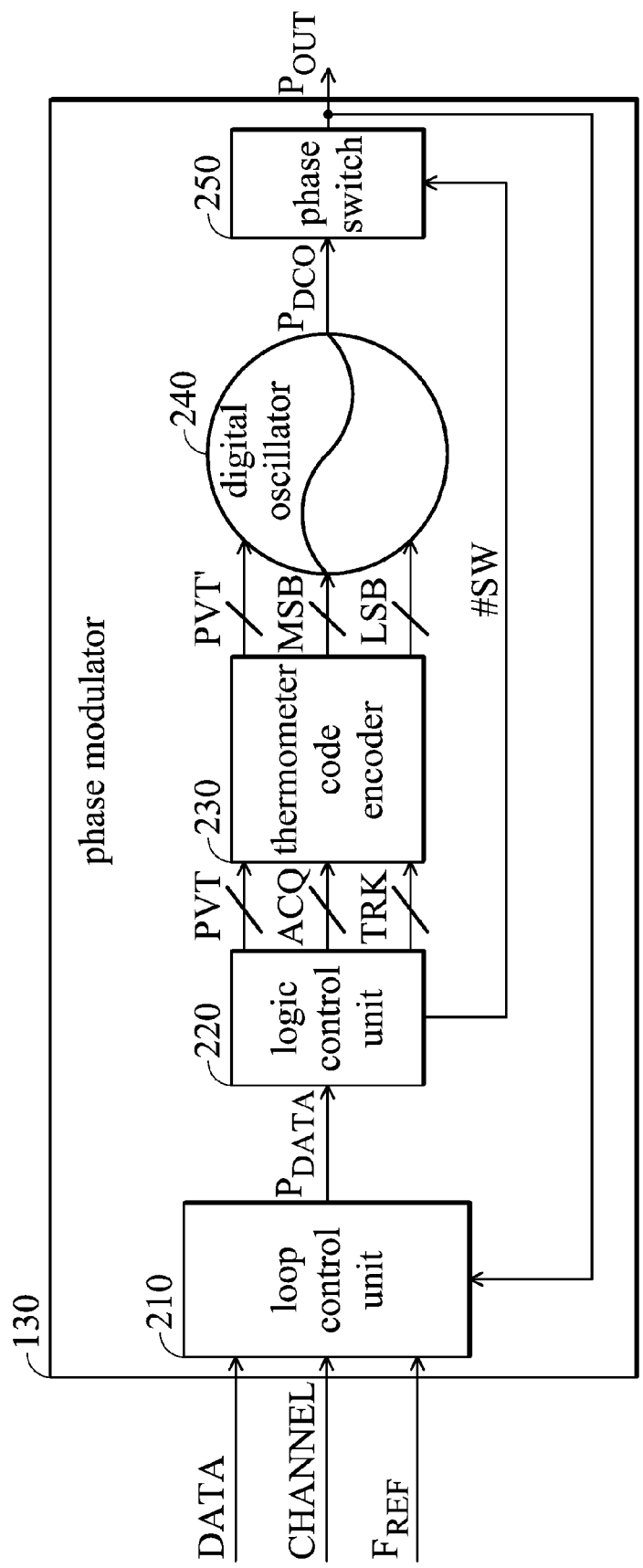
FIG. 2 shows an embodiment of a phase modulator according to FIG. 1.

FIG. 2 shows an embodiment of a phase modulator 130 according to FIG. 1. The phase modulator 130 is typically a digitalized phase-locked loop, wherein the RF signal $P_{OUT}$ is fed back to be compared with the phase sample DATA, channel frequency CHANNEL and reference frequency $F_{REF}$ to recursively approximate an accurate output. Firstly, a target frequency $P_{DATA}$ is designated by a loop control unit 210, based on the reference frequency $F_{REF}$, phase sample DATA and the RF signal $P_{OUT}$. Thereafter, a logic control unit 220 generates an oscillator control word (Oscillator Tuning Word; OTW) for control of a following digital oscillator 240. The phase sample DATA is generally provided by a polar processor 110 and the channel frequency CHANNEL is a predetermined value depending on different applications and telecommunication standards. The reference frequency $F_{REF}$ is inherently provided for a typical phase-locked loop and detailed introduction thereof is omitted.

In the embodiment, the modulation capability of the digital oscillator 240 is intentionally tuned to be from −90 degrees to +90 degrees, in which a plurality of capacitors are cascaded in parallel, controlled by the oscillator control word to synthesize a preliminary RF signal $P_{DCO}$. Actually, the modulation capability of the digital oscillator 240 is defined to be between a first phase and a second phase, where the first and second phases are separated by 180 degrees. In the invention, a phase switch 250 is utilized to provide an RF signal $P_{OUT}$ having extended phase variation ranges with reduced phase errors. The phase switch 250 is coupled to the digital oscillator 240 and the logic control unit 220, controlled by a switch signal #SW to selectively shift the preliminary RF signal $P_{DCO}$ by 180 degrees.

The switch signal #SW is generated by the logic control unit 220 depending on the magnitude of the target frequency $P_{DATA}$. For example, since the modulation capability of the digital oscillator 240 is fixed between −90 degrees to +90 degrees, if the target frequency $P_{DATA}$ exceeds the modulation capability, the digital oscillator 240 would be unable to synthesize an RF signal $P_{OUT}$ having the target frequency $P_{DATA}$. Thus, the logic control unit 220 may instead generate an oscillator control word based on the target frequency minus 180 degrees, which allows the digital oscillator 240 to synthesize a preliminary RF signal $P_{DCO}$ within its modulation capability. Meanwhile, the logic control unit 220 further sends a switch signal #SW to the phase switch 250, directing the phase switch 250 to shift the preliminary RF signal $P_{DCO}$ by 180 degrees, such that an RF signal $P_{OUT}$ having the target frequency $P_{DATA}$ is generated.

When the target frequency $P_{DATA}$ does not exceed the modulation capability, no phase shifting is required, such that the logic control unit 220 is able to generate an oscillator control word solely according to the target frequency $P_{DATA}$, allowing the digital oscillator 240 to synthesize a preliminary RF signal $P_{DCO}$ that is output as the RF signal $P_{OUT}$. In other words, the RF signal $P_{OUT}$ sent from the phase switch 250 may be a 180 degrees phase shifted result or a directly passed result from the preliminary RF signal $P_{DCO}$. Rather than shifting the preliminary RF signal $P_{DCO}$ by various phase values, the 180 degree phase shifting approach can be easily implemented without inducing much phase errors. In this way, the modulation capability is broadened for the narrow modulation capability of the digital oscillator 240.

To accurately control the digital oscillator 240 through the oscillator control word, a thermometer code encoder 230 is provided, whereby the bit values within the oscillator control word are properly arranged before being sending to the digital oscillator 240. The oscillator control word is typically a binary string comprising a Process-Voltage-Temperature (PVT) control word, an acquisition (ACQ) control word and a track (TRK) control word sequentially arranged in an order from the most significant bit (MSB) to the least significant bit (LSB). For example, the oscillator control word may comprise 24 bits, designated as OTW[0:23]. The highest 8 bits OTW[16:23] are referred to as the PVT control word, and the following 8 bits OTW[8:15] are referred to as the ACQ control word. Meanwhile, the lowest 8 bits OTW[0:7] are referred to as the TRK control word. Although the example defines 8 bits for each control word, the bit number of each control word can be flexibly adjusted, and the invention does not limit their arrangements. In another example, the PVT control word can be the first six Most Significant Bits (MSBs) of the 24 bits oscillator control word, the ACQ can be the following 7 bits, and the TRK control word can be the rest 11 bits.

The PVT control word is defined to be a rough tuning parameter of the lowest resolution, adaptable for the digital oscillator 240 to compensate for larger erroneous factors on the phase modulator 130 such as process, voltage and temperature variations of a chip. Meanwhile, the TRK control word is designated to be a fine tuning parameter with the highest resolution, which is typically adapted for carrier signal tracking. The ACQ control word has a middle tuning range and a resolution between the PVT and TRK control words, and is mostly adaptable for channel frequency switching.

Figure 3A:
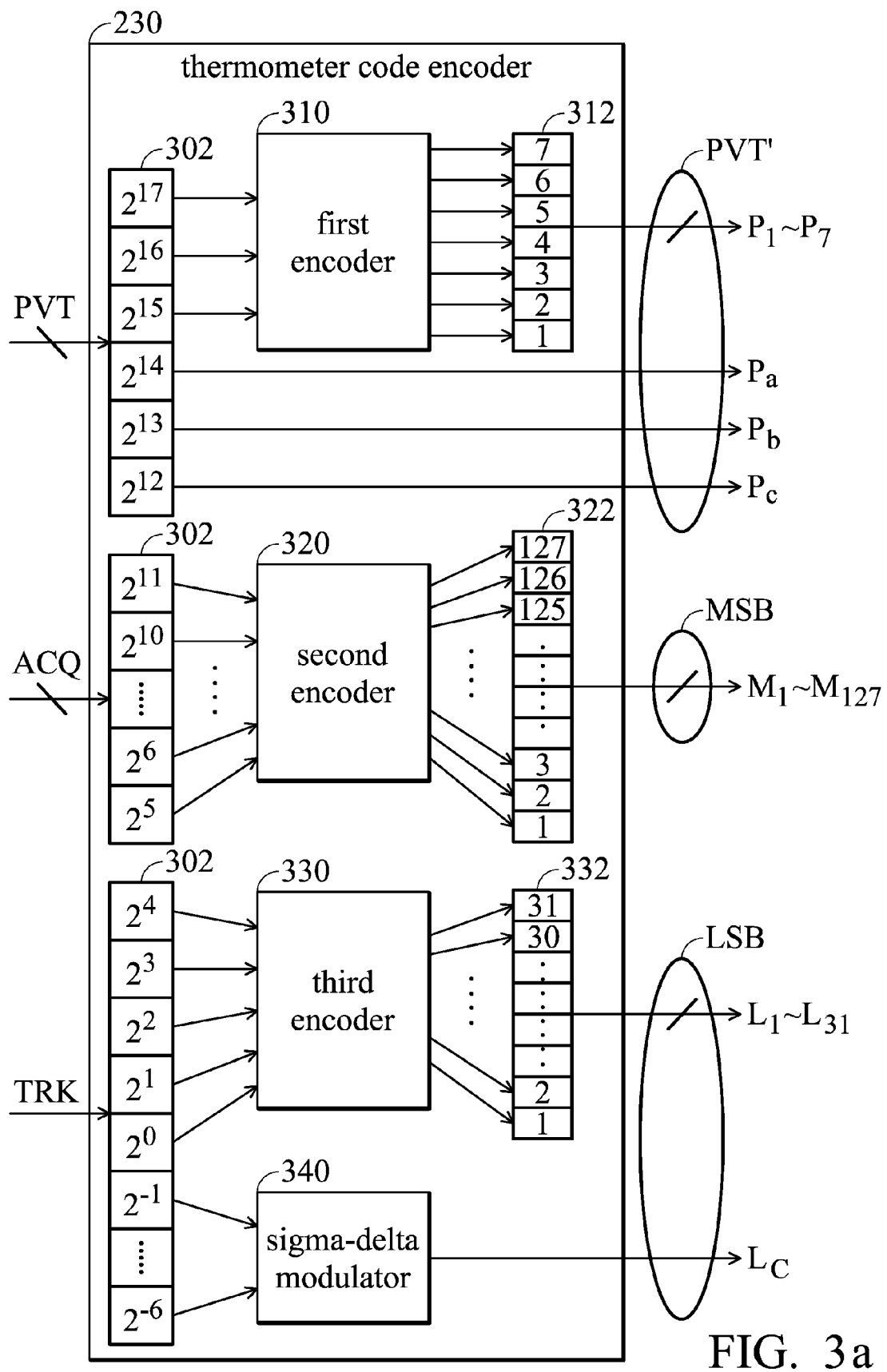
FIG. 3a shows an embodiment of a thermometer code encoder.

FIG. 3a shows an embodiment of a thermometer code encoder 230. The thermometer code encoder 230 is coupled to the logic control unit 220, comprising a register 302 for buffering the PVT, ACQ and TRK control words. A first encoder 310 may generate a first thermometer code PVT' based on the PVT control word. For example, if the embodiment is implemented to conform to the Worldwide Interoperability for Microwave Access (WiMAX) standard, the bits in the PVT control word would map to a range from 4 MHz ($2^{12}$) to 128 MHz ($2^{17}$). Thus, the first encoder 310 converts the first three MSBs (ie. $2^{15}$, $2^{16}$, and $2^{17}$) into seven equivalently weighted bits $P_1$ to $P_7$ that are referred to as the first thermometer code PVT' which is then stored in the register 312. The equivalently weighted bits are also referred to as thermometer bits. Each thermometer bit in the register 312 represents an increment of 32 MHz. In other words, each thermometer bit determines whether to contribute 32 MHz to the preliminary RF signal $P_{DCO}$.

The range of the first encoder 310 is selectable depending on application. For example, if the embodiment is implemented to conform to the Wideband Code Division Multiple Access (WCDMA) standard, the first encoder 310 may map the first four MSBs ($2^{14}$ to $2^{17}$) into fifteen thermometer bits that are buffered in the register 312 as the first thermometer code PVT'. Each thermometer bit in the register 312 stands for a 16 MHz increment in the preliminary RF signal $P_{DCO}$. In other words, the first thermometer code PVT' tunes the preliminary RF signal $P_{DCO}$ by incrementing 16 MHz to the preliminary RF signal $P_{DCO}$ per thermometer bit.

Likewise, a second thermometer code MSB is generated by the second encoder 320 based on the ACQ control word. The second thermometer code MSB is buffered in the register 322, comprising 127 equivalently weighted bits $M_1$ to $M_{127}$, wherein each equivalently weighted bits $M_1$ to $M_{127}$ fine tunes the digital oscillator 240 by hundreds of KHz or several MHz, such as 1 MHz. The fine tuned resolution of the ACQ control word is also selectable and is not limited in the example.

A third encoder 330 generates a third thermometer code LSB based on portions of the TRK control word. The third thermometer code is buffered in the register 332 comprising 31 equivalently weighted bits (thermometer bits) $L_1$ to $L_{31}$. As shown in FIG. 3a, the first five MSBs ($2^0$ to $2^4$) in the TRK control word are converted into 31 thermometer bits LSB and some of the bits (ie. $2^{-6}$ to $2^{-1}$) in the TRK control word are converted to a calibration code $L_C$ through a sigma-delta modulator 340, for serving as a fine tune parameter for the digital oscillator 240.

Figure 3B:
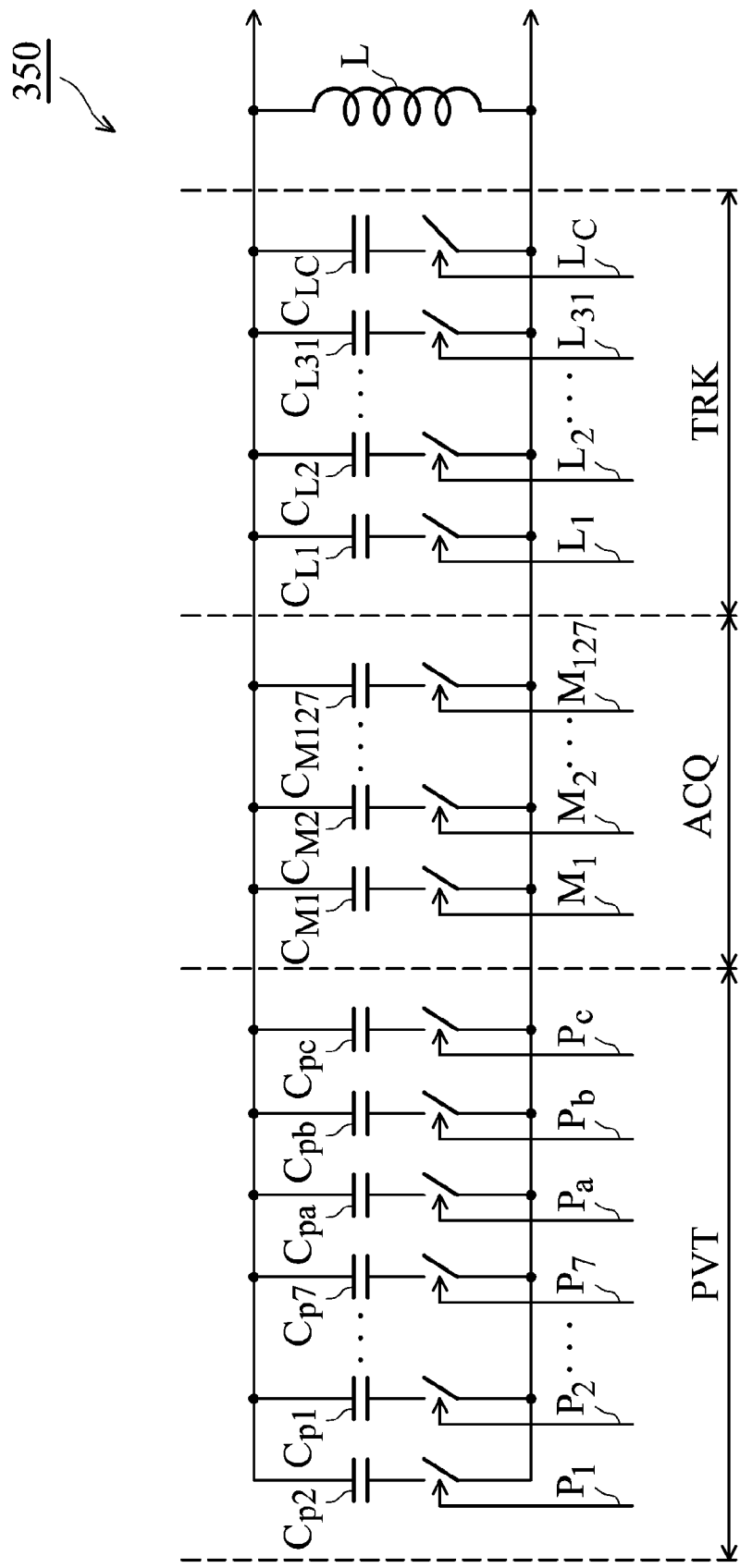
FIG. 3b shows an embodiment of a capacitor array.

FIG. 3b shows an embodiment of a capacitor array 350 of the digital oscillator 240. The digital oscillator 240 receives thermometer codes generated by the thermometer code encoder 230 to synthesize the preliminary RF signal $P_{DCO}$ of corresponding frequencies. In the digital oscillator 240, a capacitor array 350 comprises a plurality of capacitors cascaded with at least one parallel inductance. Each capacitor is switched on or off by a corresponding thermometer bit. Consequently, a total of the equivalent capacitance exhibit a capacitance-inductance constant that determines the oscillation frequency of the preliminary RF signal $P_{DCO}$. In the embodiment, the capacitors in the capacitor array 350 are categorized into a PVT group, a ACQ group and a TRK group respectively associated to the thermometer codes PVT', MSB and LSB output from the thermometer code encoder 230 of FIG. 3a. The capacitances of capacitors can be dependently designated, and the embodiment it is not limited thereto.

Figure 4:
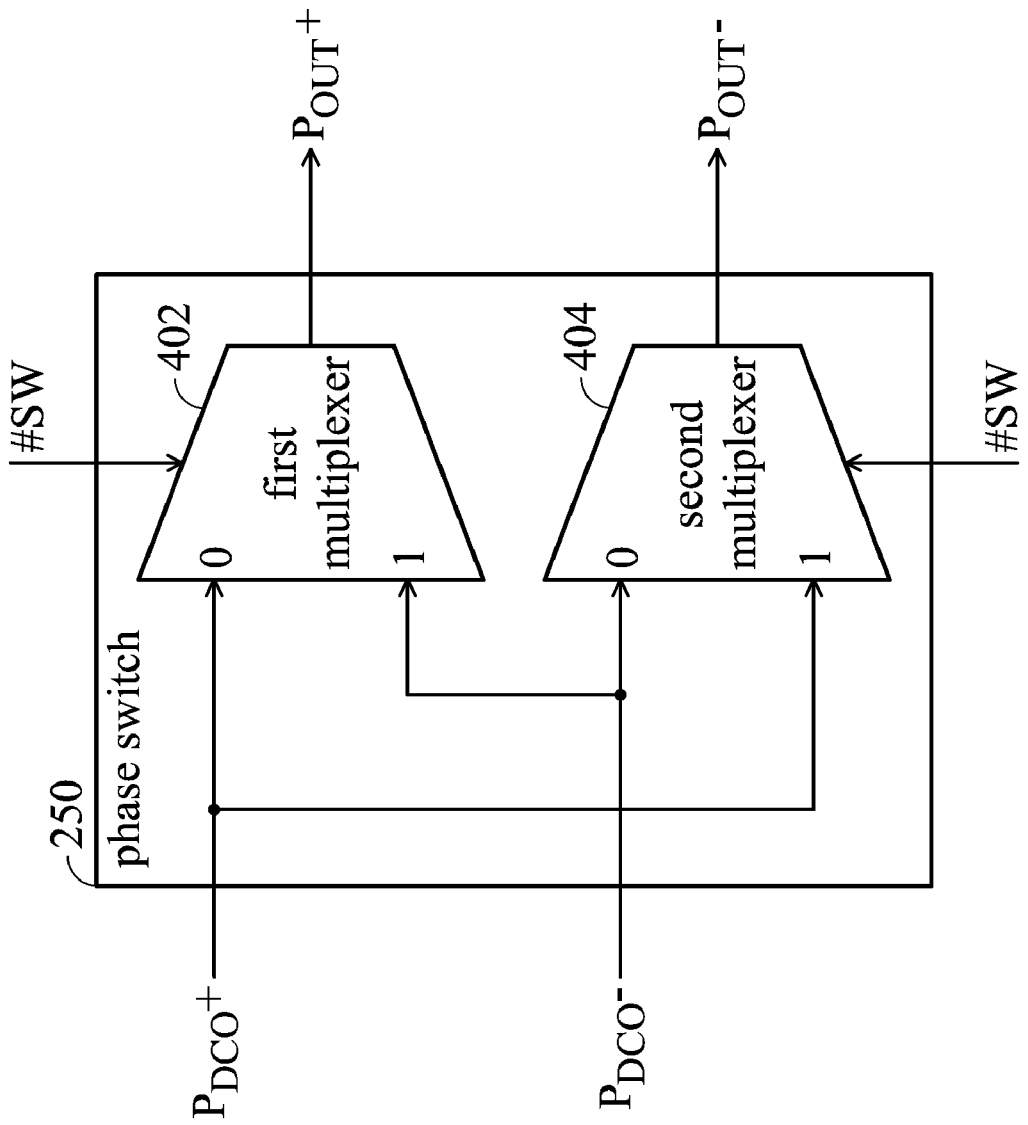
FIG. 4 shows an embodiment of a phase switch.

FIG. 4 shows an embodiment of a phase switch 250. The preliminary RF signal $P_{DCO}$ output from the digital oscillator 240 is typically a differential signal pair $P_{DCO+}$ and $P_{DCO-}$, wherein the positive signal $P_{DCO+}$ is reversed to the negative signal $P_{DCO-}$, which means their phases are separated by 180 degrees. The phase switch 250 comprises two selectors simultaneously coupled to the positive signal $P_{DCO+}$ and the negative signal $P_{DCO-}$. When the switch signal #SW presents a logic 0, the phase switch 250 directs the first multiplexer 402 to output the positive signal $P_{DCO+}$ as the positive end $P_{OUT+}$ of the RF signal, and the second multiplexer 404 to output the negative signal $P_{DCO-}$ as the negative end $P_{OUT-}$ of the RF signal. Conversely, when the switch signal #SW presents a logic 1, the first multiplexer 402 outputs the negative signal $P_{DCO-}$ as the positive end $P_{OUT+}$ of the RF signal, and the second multiplexer 404 outputs the positive signal $P_{DCO+}$ as the negative end $P_{OUT-}$ of the RF signal. In this way, the differential pair in the RF signal ($P_{OUT+}$ and $P_{OUT-}$) are reversed, which means the RF signal $P_{OUT}$ is shifted 180 degree.

Figure 5:
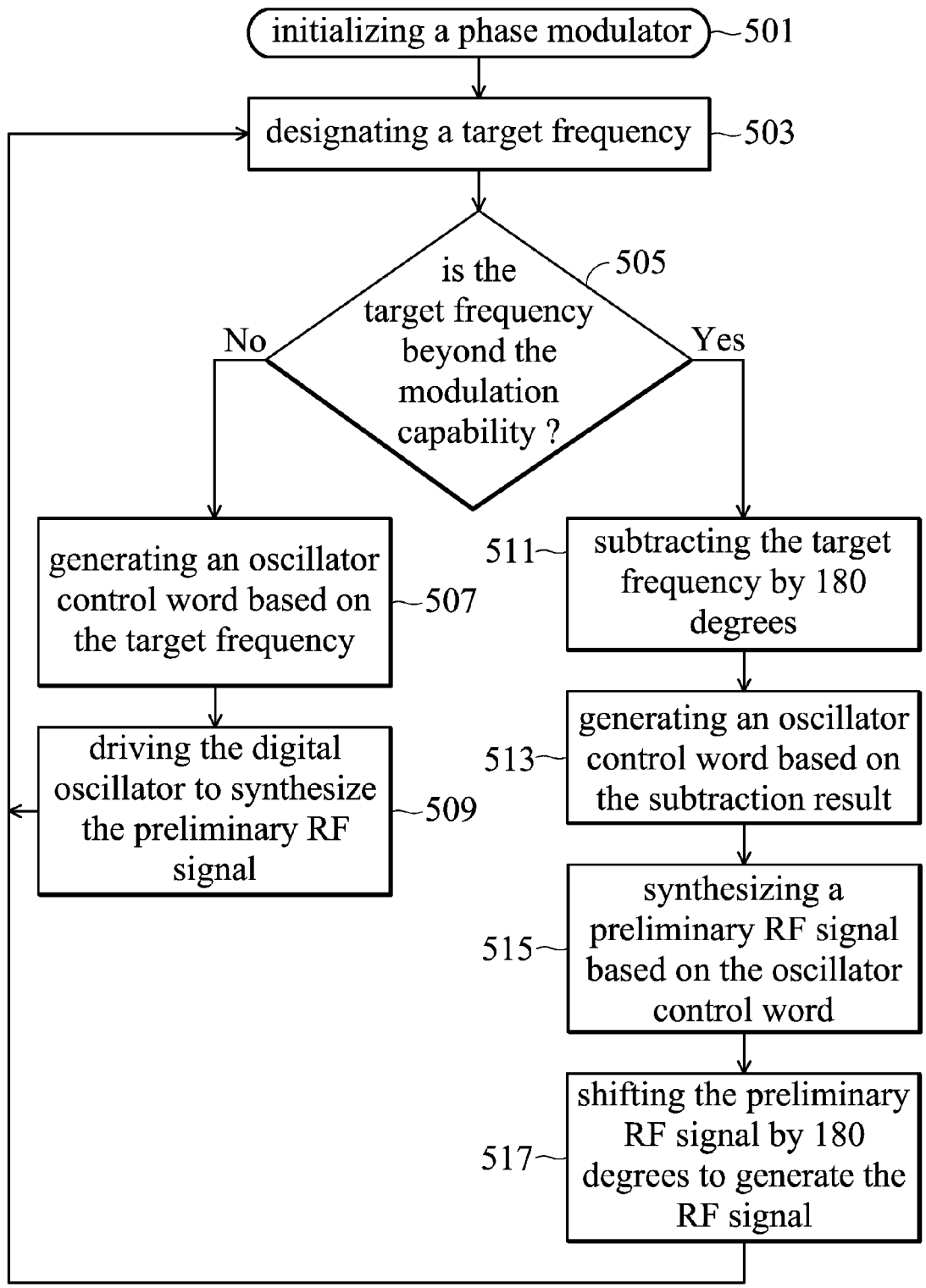
FIG. 5 is a flowchart of a phase modulation method.

FIG. 5 is a flowchart of the phase modulation method according to the invention. The described embodiments can be summarized in the following steps. In step 501, a phase modulator 130 is activated to receive the polarized phase sample DATA. In step 503, the loop control unit 210 designates a target frequency $P_{DATA}$. In step 505, the logic control unit 220 determines whether the target frequency $P_{DATA}$ is beyond the modulation capability. For example, if target frequency $P_{DATA}$ exceeds the modulation capability, step 511 is processed to perform phase shifting before synthesizing the RF signal $P_{OUT}$. If the target frequency $P_{DATA}$ is within the modulation capability, step 507 is processed, wherein the RF signal $P_{OUT}$ is directly synthesized according to the target frequency $P_{DATA}$. Specifically, the thermometer code encoder 230 converts the oscillator control word into thermometer codes PVT', MSB and LSB of various ranges, and controls the digital oscillator 240 by linear combinations of the thermometer codes. In step 509, a plurality of capacitors in the digital oscillator 240 are respectively driven by the thermometer codes PVT', MSB and LSB to synthesize the preliminary RF signal $P_{DCO}$.

In step 507, the preliminary RF signal $P_{DCO}$ is directly output as the RF signal $P_{OUT}$. Conversely, in step 511, the RF signal $P_{OUT}$ is synthesized by phase shifting the preliminary RF signal $P_{DCO}$. In step 511, to generate the preliminary RF signal $P_{DCO}$, the target frequency is first subtracted by 180 degrees to generate the oscillator control word. For example, if the target frequency is 130 degrees, it would be −50 degrees after the subtraction. In step 513, the logic control unit 220 generates the oscillator control word based on the −50 degrees. In step 515, the oscillator control word is converted into thermometer codes PVT', MSB and LSB to trigger corresponding capacitors within the digital oscillator 240, such that a preliminary RF signal $P_{DCO}$ is synthesized. In step 517, the phase switch 250 sends a switch signal #SW to shift the preliminary RF signal $P_{DCO}$ by 180 degrees, such that an RF signal $P_{OUT}$ having the target frequency is generated.

Figure 6:
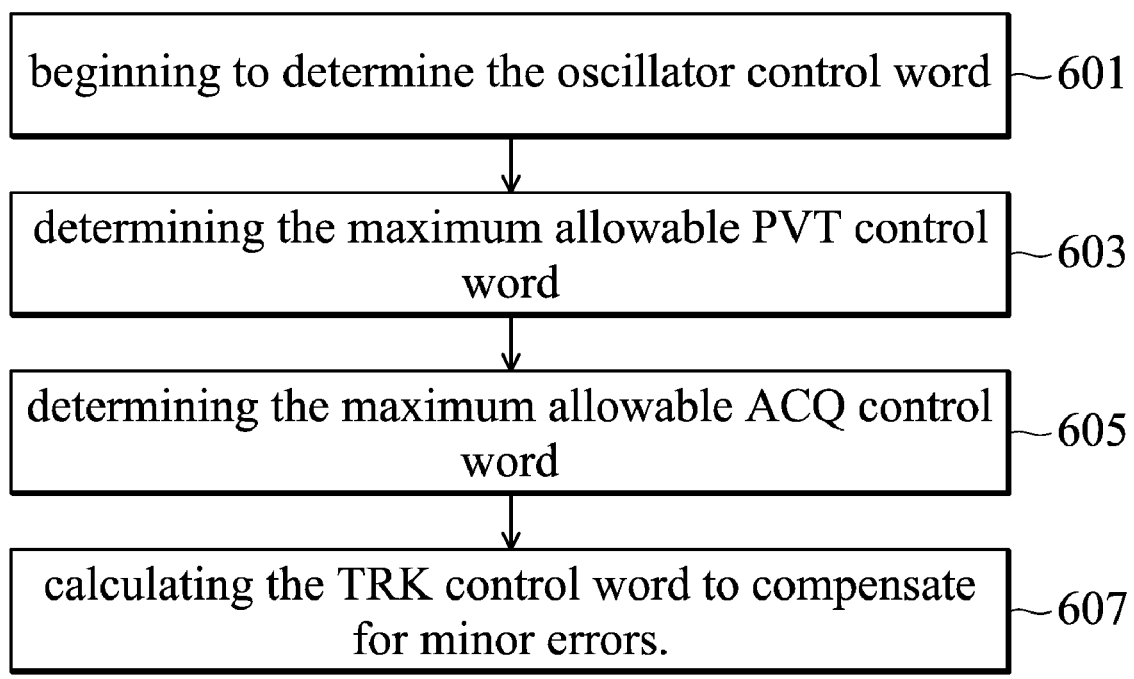
FIG. 6 is a flowchart of designating an oscillator control word.

FIG. 6 is a flowchart of determining the oscillator control word. The oscillation frequency of the preliminary RF signal $P_{DCO}$ is determined by linear combination of the PVT control word, the ACQ control word and the TRK control word. A control word of a large range must be determined prior to that of a small range, such that capacitor requirements can be effectively reduced. As described, the PVT control word has the largest tuning range, the ACQ control word the second largest tuning range, and the TRK control word has the smallest tuning range. In step 601, a process is initialized to determine the oscillator control word as required in step 507 or step 513. In step 603, the maximum allowable PVT control word is determined first. If a bit increment of the PVT control word is able to shift 30 degrees, and the target frequency is located at 50 degrees, the most approximate degrees generated by the PVT control word would be 2×30=60 degrees. In step 605, since 60 degrees is generated by the PVT control word, a −10 degrees is required to approximate 50 degrees from the 60 degrees. If each increment of the ACQ control word can shift 1 degree, the ACQ control word can be configured to render 10×1 degrees. In step 607, the TRK control word can be further calculated to compensate for some other minor errors.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase modulator, adaptable for a polar transmitter to generate a phase varying radio frequency (RF) signal based on a phase sample, comprising:
    a loop control unit, designating a target frequency based on a reference frequency, the phase sample and the RF signal;
    a logic control unit, generating an oscillator control word based on the target frequency;
    a digital oscillator, having a capability to modulate from a first phase to a second phase, for synthesizing a preliminary RF signal based on the oscillator control word; wherein the first phase and the second phase are separated by 180 degrees;
    a phase switch, coupled to the digital oscillator and the logic control unit, selectively shifting the preliminary RF signal by 180 degrees based on a switch signal; wherein,
    when the target frequency exceeds the modulation capability of the digital oscillator, the logic control unit generates the oscillator control word based on the target frequency minus 180 degrees, and sends a switch signal to direct the phase switch to shift the preliminary RF signal by 180 degrees, such that the RF signal is synthesized to have the target frequency, and
    when the target frequency does not exceed the modulation capability of the digital oscillator, the logic control unit generates the oscillator control word solely based on the target frequency, and the phase switch directly outputs the preliminary RF signal to be the RF signal having the target frequency.

2. The phase modulator as claimed in claim 1, wherein the first phase is −90 degrees, and the second phase is +90 degrees.

3. The phase modulator as claimed in claim 1, wherein the loop control unit designates the target frequency further based on a channel frequency control word.

4. The phase modulator as claimed in claim 1, wherein:
the oscillator control word comprises a Process-Voltage-Temperature (PVT) control word, an acquisition (ACQ) control word and a track (TRK) control word, and the phase modulator further comprises a thermometer code encoder coupled to the logic control unit for generating a first thermometer code based on portions of the PVT control word, generating a second thermometer code based on the ACQ control word, and generating a third thermometer code based on portions of the TRK control word; and
the digital oscillator comprises a plurality of capacitors respectively controlled by the first, second and third thermometer codes to help synthesize the preliminary RF signal.

5. The phase modulator as claimed in claim 4, wherein the thermometer code encoder converts the ACQ control word into 127 equivalently weighted bits that jointly constitute the second thermometer code, and each equivalently weighted bit contributes 1 MHz to the RF signal.

6. The phase modulator as claimed in claim 4, wherein the thermometer code encoder converts the first five MSBs of the TRK control word into 31 equivalently weighted bits that jointly constitute the third thermometer code.

7. The phase modulator as claimed in claim 4, wherein the thermometer code encoder converts the first three most significant bits (MSBs) of the PVT control word into seven equivalently weighted bits that jointly constitute the first thermometer code.

8. The phase modulator as claimed in claim 7, wherein the RF signal conforms to the Worldwide Interoperability for Microwave Access (WiMAX) standard, and each equivalently weighted bit of the first thermometer code contributes 32 MHz to the RF signal.

9. The phase modulator as claimed in claim 4, wherein the thermometer code encoder converts the first four MSBs of the PVT control word into fifteen equivalently weighted bits that jointly constitute the first thermometer code.

10. The phase modulator as claimed in claim 9, wherein the RF signal conforms to the Wideband Code Division Multiple Access (WCDMA) standard, and each equivalently weighted bit of the first thermometer code contributes 16 MHz to the RF signal.

11. The phase modulator as claimed in claim 4, wherein:
the logic control unit performs a linear combination on the PVT control word, the ACQ control word and the TRK control word to generate the target frequency; and
when the target frequency is designated, the logic control unit first determines a maximum allowable value of the PVT control word, second determines a maximum allowable value of the ACQ control word, and last determines the TRK control word to generate the target frequency.

12. The phase modulator as claimed in claim 11, wherein the oscillator control word comprises 24 bits and the first six MSBs are the PVT control word, the following seven bits are ACQ control words, and the remaining eleven bits are the TRK control word.

13. A polar transmitter, for synthesizing an RF signal from a baseband signal, comprising:
a polar processor, transforming the baseband signal into a magnitude sample and a phase sample;
a magnitude modulator, generating a magnitude control signal based on the magnitude sample;
a phase modulator, using the phase sample to synthesize the RF signal having variable phases; and
a digital power amplifier, receiving the magnitude control signal to amplify and transmit the RF signal, wherein,
the phase modulator comprises:
a loop control unit, designating a target frequency based on a reference frequency, the phase sample and the RF signal;
a logic control unit, generating an oscillator control word of binary form based on the target frequency;
a digital oscillator, having a capability to modulate from a first phase to a second phase, for synthesizing a preliminary RF signal based on the oscillator control word; and
a phase switch, coupled to the digital oscillator and the logic control unit, selectively shifting the preliminary RF signal by 180 degrees based on a switch signal;
wherein:
when the target frequency exceeds the modulation capability of the digital oscillator, the logic control unit generates the oscillator control word based on the target frequency minus 180 degrees, and sends a switch signal to direct the phase switch to shift the preliminary RF signal by 180 degrees, such that the RF signal is synthesized to have the target frequency; and
when the target frequency does not exceed the modulation capability of the digital oscillator, the logic control unit generates the oscillator control word solely based on the target frequency, and the phase switch directly outputs the preliminary RF signal to be the RF signal having the target frequency.

14. The polar transmitter as claimed in claim 13, wherein the loop control unit designates the target frequency further based on a channel frequency control word.

15. The polar transmitter as claimed in claim 13, wherein:
the oscillator control word comprises a Process-Voltage-Temperature (PVT) control word, an acquisition (ACQ) control word and a track (TRK) control word, and the phase modulator further comprises a thermometer code encoder coupled to the logic control unit for generating a first thermometer code based on portions of the PVT control word, generating a second thermometer code based on the ACQ control word, and generating a third thermometer code based on portions of the TRK control word; and
the digital oscillator comprises a plurality of capacitors respectively controlled by the first, second and third thermometer codes to help synthesize the preliminary RF signal.

16. The polar transmitter as claimed in claim 15, wherein the thermometer code encoder converts the first three most significant bits (MSBs) of the PVT control word into seven equivalently weighted bits that jointly constitute the first thermometer code.

17. The polar transmitter as claimed in claim 16, wherein the RF signal conforms to the Worldwide Interoperability for Microwave Access (WiMAX) standard, and each equivalently weighted bit of the first thermometer code contributes 32 MHz to the RF signal.

18. The polar transmitter as claimed in claim 15, wherein the thermometer code encoder converts the first four MSBs of the PVT control word into fifteen equivalently weighted bits that jointly constitute the first thermometer code.

19. The polar transmitter as claimed in claim 18, wherein the RF signal conforms to the Wideband Code Division Multiple Access (WCDMA) standard, and each equivalently weighted bit of the first thermometer code contributes 16 MHz to the RF signal.

20. The polar transmitter as claimed in claim 15, wherein the thermometer code encoder converts the ACQ control word into 127 equivalently weighted bits that jointly constitute the second thermometer code, and each equivalently weighted bit contributes 1 MHz to the RF signal.

21. The polar transmitter as claimed in claim 15, wherein the thermometer code encoder converts the first five MSBs of the TRK control word into 31 equivalently weighted bits that jointly constitute the third thermometer code.

22. The polar transmitter as claimed in claim 15, wherein:
the logic control unit performs a linear combination on the PVT control word, the ACQ control word and the TRK control word to generate the target frequency; and
when the target frequency is designated, the logic control unit first determines a maximum allowable value of the PVT control word, second determines a maximum allowable value of the ACQ control word, and last determines the TRK control word to generate the target frequency.

23. The polar transmitter as claimed in claim 22, wherein the oscillator control word comprises 24 bits, wherein the first six MSBs are the PVT control word, the following seven bits are ACQ control words, and the remaining eleven bits are the TRK control word.

24. The polar transmitter as claimed in claim 13, wherein the first phase is −90 degrees, and the second phase is +90 degrees.

25. A phase modulation method, adaptable for a polar transmitter to generate a radio frequency (RF) signal of variable phases based on a phase sample, comprising:
designating a target frequency by comparing the RF signal with a reference frequency and the phase sample;
generating an oscillator control word based on the target frequency;
providing a digital oscillator having a capability to modulate from a first phase to a second phase, for synthesizing a preliminary RF signal based on the oscillator control word;
when the target frequency exceeds the modulation capability of the digital oscillator, generating the oscillator control word based on the target frequency minus 180 degrees, and shifting the preliminary RF signal by 180 degrees to be the RF signal having the target frequency; and
when the target frequency does not exceed the modulation capability of the digital oscillator, generating the oscillator control word solely based on the target frequency, and directly outputting the preliminary RF signal to be the RF signal having the target frequency.

26. The phase modulation method as claimed in claim 25, wherein the first phase is −90 degrees, and the second phase is +90 degrees.

27. The phase modulation method as claimed in claim 25, wherein:
the oscillator control word comprises a Process-Voltage-Temperature (PVT) control word, an acquisition (ACQ) control word and a track (TRK) control word, and the phase modulator further comprises a thermometer code encoder coupled to the logic control unit for generating a first thermometer code based on portions of the PVT control word, generating a second thermometer code based on portions of the ACQ control word, and generating a third thermometer code based on portions of the TRK control word; and
the digital oscillator comprises a plurality of capacitors respectively controlled by the first, second and third thermometer codes to help synthesize the preliminary RF signal.

28. The phase modulation method as claimed in claim 27, wherein the thermometer code encoder converts the first three most significant bits (MSBs) of the PVT control word into seven equivalently weighted bits that jointly constitute the first thermometer code.

29. The phase modulation method as claimed in claim 28, wherein the RF signal conforms to the Worldwide Interoperability for Microwave Access (WiMAX) standard, and each equivalently weighted bit of the first thermometer code contributes 32 MHz to the RF signal.

30. The phase modulation method as claimed in claim 27, wherein the thermometer code encoder converts the first four MSBs of the PVT control word into fifteen equivalently weighted bits that jointly constitute the first thermometer code.

31. The phase modulation method as claimed in claim 30, wherein the RF signal conforms to the Wideband Code Division Multiple Access (WCDMA) standard, and each equivalently weighted bit of the first thermometer code contributes 16 MHz to the RF signal.

32. The phase modulation method as claimed in claim 27, wherein the thermometer code encoder converts the ACQ control word into 127 equivalently weighted bits that jointly constitute the second thermometer code, and each equivalently weighted bit contributes 1 MHz to the RF signal.

33. The phase modulation method as claimed in claim 27, wherein the thermometer code encoder converts the first five MSBs of the TRK control word into 31 equivalently weighted bits that jointly constitute the third thermometer code.

34. The phase modulation method as claimed in claim 25, wherein designation of the target frequency is further based on a channel frequency control word.

35. The phase modulation method as claimed in claim 34, wherein generation of the target frequency comprises:
first determining a maximum allowable value of the PVT control word;
second determining a maximum allowable value of the ACQ control word;
last determining the TRK control word to generate the target frequency; and
performing a linear combination on the PVT control word, the ACQ control word and the TRK control word to generate the target frequency.

36. The phase modulation method as claimed in claim 35, wherein the oscillator control word comprises 24 bits, wherein the first six MSBs are the PVT control word, the following seven bits are ACQ control words, and the remaining eleven bits are the TRK control word.

* * * * *